United States Patent
de Figueiredo (10) Patent No.: US 9,906,234 B2
(45) Date of Patent: Feb. 27, 2018

(54) INTERLEAVED ANALOG-TO-DIGITAL CONVERTER AND METHOD FOR CALIBRATING AN INTERLEAVED ANALOG-TO-DIGITAL CONVERTER

(71) Applicant: Synopsys, Inc., Mountain View, CA (US)

(72) Inventor: Pedro Miguel Ferreira de Figueiredo, São Domingos de Rana (PT)

(73) Assignee: Synopsys, Inc., Mountain View, CA (US)

( * ) Notice: Subject to any disclaimer, the term of this patent is extended or adjusted under 35 U.S.C. 154(b) by 1 day.

(21) Appl. No.: 15/319,162

(22) PCT Filed: Jun. 30, 2014

(86) PCT No.: PCT/US2014/044957
§ 371 (c)(1),
(2) Date: Dec. 15, 2016

(87) PCT Pub. No.: WO2016/003432
PCT Pub. Date: Jan. 7, 2016

(65) Prior Publication Data
US 2017/0134033 A1 May 11, 2017

(51) Int. Cl.
*H03M 1/10* (2006.01)
*H03M 1/12* (2006.01)

(52) U.S. Cl.
CPC ....... *H03M 1/1009* (2013.01); *H03M 1/1215* (2013.01)

(58) Field of Classification Search
CPC .... H03M 1/1009; H03M 1/1215; H03M 1/12; H03M 1/00
(Continued)

(56) References Cited

U.S. PATENT DOCUMENTS 4,968,988 A * 11/1990 Miki .................. H03M 1/0651
341/118
5,294,926 A 3/1994 Corcoran
(Continued)

OTHER PUBLICATIONS

PCT International Search Report, PCT Application No. PCT/US2014/044957, Oct. 31, 2014, 18 pages.
(Continued)

*Primary Examiner* — Jean B Jeanglaude
(74) *Attorney, Agent, or Firm* — Fenwick & West LLP (57) ABSTRACT

An interleaved analog-to-digital converter, ADC, includes a first and a second sub-ADC ($ADC_1$, $ADC_2$) and a timing control unit (TC). The first sub-ADC ($ADC_1$) is configured to convert a first calibration signal ($V1_{cal}$) into a first calibration code ($CC_1$) depending on a first sub-clock signal ($\Phi_1$). The second sub-ADC ($ADC_2$) includes a programmable delay element ($DE_2$) configured to generate a calibrated second sub-clock signal ($\Phi_2'$) by shifting a phase of a second sub-clock signal ($\Phi_2$) by a delay depending on a control signal. The second sub-ADC ($ADC_2$) is configured to convert a second calibration signal ($V2_{cal}$) into a second calibration code ($CC_2$) depending on the calibrated second sub-clock signal ($\Phi_2'$). The timing control (TC) unit generates the control signal (CS) comparing the second calibration code ($CC_2$) to the first calibration code ($CC_1$).

22 Claims, 3 Drawing Sheets (58) Field of Classification Search
USPC .......................................... 341/118, 155, 120
See application file for complete search history.

(56) References Cited

U.S. PATENT DOCUMENTS

| | | | | |
|---|---|---|---|---|
| 8,730,072 | B2* | 5/2014 | Petigny | H03M 1/1061 |
| | | | | 341/120 |
| 9,071,262 | B1* | 6/2015 | Malkin | H04B 17/21 |
| 9,401,726 | B2* | 7/2016 | Ragab | H03M 1/0626 |
| 2006/0250288 | A1 | 11/2006 | Fernandez et al. | |
| 2008/0174461 | A1 | 7/2008 | Hsu | |
| 2008/0272952 | A1 | 11/2008 | Wood | |
| 2009/0141558 | A1 | 6/2009 | Sarin et al. | |
| 2009/0243907 | A1 | 10/2009 | Nazemi et al. | |
| 2012/0050082 | A1 | 3/2012 | Danesh et al. | |
| 2013/0106632 | A1 | 5/2013 | Petigny et al. | |

OTHER PUBLICATIONS

Stepanovic, D., "Calibration Techniques for Time-Interleaved SAR A/D Converters," Technical Report UCB/EECS-2012-225, Dec. 4, 2012, 116 pages, [Online] May be retrieved at<URL:http://www.eecs.berkeley.edu/Pubs/TechRpts/2012/EECS-2012-225.pdf>.

* cited by examiner

INTERLEAVED ANALOG-TO-DIGITAL CONVERTER AND METHOD FOR CALIBRATING AN INTERLEAVED ANALOG-TO-DIGITAL CONVERTER

The disclosure relates to an interleaved analog-to-digital converter, ADC, and to a method for calibrating an interleaved ADC, in particular for calibrating clock phases in an interleaved ADC.

BACKGROUND

High-speed ADCs are often implemented by associating several sub-ADCs in parallel and operating them in an interleaved mode to effectively multiply the conversion speed of the sub-ADCs. For example, by associating four sub-ADCs the speed is effectively increased by a factor of four.

The phases of the sampling clocks for an interleaved ADC comprising n sub-ADCs should theoretically be precisely $2\pi/n$ apart from each other and the sub-ADCs should be matched in gain and offset. Errors in any of those parameters commonly cause spurs at the output spectrum that degrade the spurious-free dynamic range, SFDR, and the signal-to-noise ratio, SNR. Known implementations of interleaved ADCs may include calibration of the offset and gain of the sub-ADCs. However, for modern applications the effect of phase mismatches may be one of the dominant factors limiting the ADC performance. For example, the sampling time mismatches of sub-ADCs may be required to be smaller than 1 ps in order to avoid a significant degradation of performance.

The sampling phases of the sub-ADCs are commonly generated by a master clock generator. Due to variations in fabrication processes, the clock circuit paths corresponding to the sub-ADCs may exhibit slightly different delays, which prevents the sampling instants from being exactly $2\pi/n$ apart from each other.

Known timing mismatch calibration techniques typically require a significant amount of time to converge, impose limitations to the input signal bandwidth, or depend on input signal properties. Some solutions use adaptive digital filters with a large number of taps, which results in high power consumption and complexity, and limit the achievable sampling frequency. It is desirable to overcome these limitations.

DETAILED DESCRIPTION

In the following the disclosed configuration is explained in detail with the aid of exemplary implementations by reference to the drawings. Components that are functionally identical or have an identical effect may be denoted by identical references. Identical or effectively identical components may be described only with respect to the figure where they occur first, their description is not necessarily repeated in successive figures.

Configuration Overview

Disclosed is an improved concept for interleaved analog-to-digital conversion to achieve an improved phase matching. According to an improved concept programmable delay elements within sub-ADCs of an interleaved ADC are adjusted to calibrate phase mismatches. To this end a calibration signal is applied to a sub-ADC being calibrated and a digital output calibration code is compared to a reference calibration code.

An example implementation of an interleaved ADC according to the improved concept comprises a first sub-ADC, a second sub-ADC and a timing control unit. The first sub-ADC is configured to convert a first calibration signal into a first calibration code depending on a first sub-clock signal. The second sub-ADC comprises a programmable delay element that is configured to generate a calibrated second sub-clock signal by shifting a phase of a second sub-clock signal by a delay depending on a control signal. The second sub-ADC is further configured to convert a second calibration signal into a second calibration code depending on the second sub-clock signal, in particular on the calibrated second sub-clock signal. The timing control unit is coupled to the first and the second sub-ADC and is configured to generate the control signal based on a comparison of the second calibration code to the first calibration code.

An interleaved ADC according to the improved concept may for example comprise further sub-ADCs with respective sub-clock signals in addition to the first and the second sub-ADC. In such an ADC, the assignment of one of the sub-ADCs comprised by the ADC to be the first sub-ADC and another one of the sub-ADCs comprised by the ADC to be the second sub-ADC is naturally not necessarily fixed. In particular, one of the further sub-ADCs may as well be assigned to take over the role of for example the first or the second sub-ADC. In this way respective sub-clock signals of several, in particular of all, sub-ADCs comprised by the ADC may be adjusted according to the description above and/or below.

The first sub-ADC may for example comprise a first sample switch and a first sample capacitor, while the second sub-ADC may for example comprise a second sample switch and a second sample capacitor. The first and the second sub-clock signal may for example cause the first and the second sample switch, respectively, to close depending on the first and the second calibration signal, respectively, and consequently the first and the second sample capacitor to be charged. The first and the second sub-clock signal may then for example cause the first and the second sample switch, respectively, to open again. Then a first and a second charge are stored on the first and the second sample capacitor, respectively, said charges depending on the first and the second calibration signal, respectively, during the time the first and the second sample switch have been closed. The first and the second sub-ADC then for example generate the first and the second calibration code, respectively, depending on the first and the second charge, respectively.

The first and the second sub-clock signal may for example have the same period. For example, the first and the second sub-clock signal may be derived from a reference clock signal, for example given by a general sampling clock signal of the interleaved ADC. The period of the first and the second sub-clock signal may then for example be equal to a period of the sampling clock signal times the number of sub-ADCs comprised by the interleaved ADC. In other implementations, the period of the first and the second sub-clock signal may for example be equal to the period of the sampling clock signal times a number being smaller that the number of sub-ADCs comprised by the interleaved ADC. This may be particularly suitable in implementations where one or more of the sub-ADCs are not converting the analog input signal into the digital output code during certain periods.

Phases of the first and the second sub-clock signal and of respective sub-clock signals of remaining sub-ADCs comprised by the interleaved sub-ADC may for example be shifted with respect to each other. In particular each of said phases may be shifted by a defined phase shift with respect to one of said phases. In particular the defined phase shift may be $2\pi/N$, wherein N is the total number of sub-ADCs comprised by the interleaved ADC.

The first and the second calibration signal may for example have the same time dependence, for example up to a time shift.

In a perfectly calibrated system, the first and the second sample capacitor would for example sample exactly the same charge. Consequently, in such a perfectly calibrated system, the first and the second calibration code would be identical. In a real system, however, there may be differences between the first and the second calibration code for example due to the first and the second sample capacitor sampling slightly different charges.

For example, the first and the second calibration signal may increase with time and the second sample capacitor may sample a charge that is for example smaller than a charge sampled by the first sample capacitor. Consequently a value corresponding to the second calibration code is smaller than a value corresponding to the first calibration code. In an opposite situation where the second sample capacitor for example samples a charge being larger than the charge sampled by the first sample capacitor, it follows analogously that the value corresponding to the second calibration code may for example be larger than the value corresponding to the first calibration code.

In some implementations of the interleaved ADC, the first and the second calibration signal are time shifted versions of a calibration signal, shifted by a first and a second time shift with respect to the calibration signal, respectively. Therein, the first and the second time shift are given by integer multiples of a clock period of a reference clock signal.

The reference clock signal may for example be given by the general sampling clock signal of the interleaved ADC. The sampling clock signal may for example be generated by a clock generator. As mentioned above, the first and the second sub-clock signal may for example feature periods that are an integer multiple of the clock period of the sampling clock signal. In particular, the periods of the first and the second sub-clock signal may be given by the clock period of the sampling clock signal times a number of sub-ADCs being operated at the same time in an interleaved fashion to convert an analog input signal into a digital output code.

The first and the second calibration signal are for example applied to the first and the second sub-ADC, respectively, synchronously with the sampling clock signal. Consequently, the first and the second time shift are given by integer multiples of the clock period for example of the sample clock signal. Apart from the first and the second time shift, the first and the second sub-clock signal may therefore be for example equal.

The first and the second calibration signal are preferably supplied by a common supply line and generated by a common source. The first and the second calibration signal may for example correspond to a first and a second time period of a common signal. The common signal may for example consist of repetitions of the calibration signal with or without periods of zero signal in between. For example, the timing control unit is configured and arranged to control the generation of the common signal such that the first and the second time shift are achieved and match corresponding sampling instants of the first and the second sub-ADC, respectively.

According to some implementations of the interleaved ADC, the first and the second calibration signal are represented by an increasing voltage ramp. In such an implementation the timing control unit is configured to generate the control signal such that it causes the delay element to increase the delay if a value represented by the second calibration code is smaller than a value represented by the first calibration code. Furthermore, the timing control unit is configured to generate the control signal such that it causes the delay element to reduce the delay if the value represented by the second calibration code is larger than the value represented by the first calibration code.

In this way, for example a timing mismatch between an actuation of the first and the second sample switch may be reduced. In other words a mismatch between the charges sampled on the first and the second sample capacitor may be reduced. After the second sub-clock signal has been adjusted, in particular by increasing or reducing the delay, the described procedure may for example be repeated or repeated several times to further decrease said mismatches.

In alternative implementations of the interleaved ADC, the calibration signal is represented by a decreasing voltage ramp. In such an implementation the timing control unit is configured to generate the control signal such that it causes the delay element to reduce the delay if the value represented by the second calibration code is smaller than the value represented by the first calibration code. Furthermore, the timing control unit is configured to generate the control signal such that it causes the delay element to increase the delay if the value represented by the second calibration code is larger than the value represented by the first calibration code.

In some implementations of the interleaved ADC, the first and the second calibration signal represent strictly increasing or strictly decreasing functions of time.

By strictly increasing and strictly decreasing functions in the sense of the present disclosure, it is meant that the first calibration signal is strictly increasing or strictly decreasing during being sampled by the first sub-ADC and that the second calibration signal is strictly increasing or strictly decreasing during being sampled by the second sub-ADC. Apart from these sampling periods, the first and the second calibration signal may deviate from being strictly increasing or strictly decreasing, in particular may be constant, for example may be equal to zero.

Such implementations may be particularly beneficial for example when the first and the second calibration signal are equal up to the first and the second time shift. In such a case it may not be necessary to know the functional dependencies of the first and the second calibration signal on time in detail. In fact, the direction in which the phase of the second sub-clock signal has to be shifted follows then alone from the value corresponding to the second calibration code compared to the value corresponding to the first calibration code. For example by adjusting the second sub-clock phase iteratively in small steps, an exact knowledge of said functional dependences may not be necessary.

The time it takes for the voltage ramp to vary by a value corresponding to a least significant bit of the ADC may for example set the minimum detectable amount of mismatch of sampling instants. Consequently this time should be comparatively short. A required minimum increase or decrease rate of the voltage ramp may for example depend on a frequency and/or an amplitude of the analog input signal as well as for example on a resolution of the interleaved ADC. As described above the voltage ramp may be strictly increasing or strictly decreasing. The voltage ramp does not necessarily need to comply with another restriction. In particular the time dependence of the voltage ramp may be linear but may also be non-linear. In fast ADCs a spread of the delay on the sub-clock signals is for example much lower than a rise time of a CMOS gate. Therefore, the voltage ramp may for example be an output of a CMOS inverter.

According to some implementations the interleaved ADC further comprises a control unit. The control unit is configured to trigger the first sub-ADC to convert the first calibration signal into a first calibration code depending on a first sub-clock signal and the second sub-ADC to convert the second calibration signal into the second calibration code depending on the calibrated second sub-clock signal. Furthermore, the control unit is for example configured to trigger the timing control unit to generate the control signal based on the comparison of the second calibration code to the first calibration code. The control unit is for example configured to trigger said actions consecutively for a defined number of times. Alternatively the control unit is configured to trigger said actions consecutively until the second calibration code and the first calibration code are identical up to a threshold.

In such implementations, the second sub-clock signal may for example be iteratively adjusted until it matches the first sub-clock signal in the sense that the second calibration code matches the first calibration code.

The control unit may for example be comprised by the timing control unit, by an interleaver unit of the interleaved ADC or by another component. By above mentioned consecutively performing the described adjustment, the second delay corresponding to the second sub-ADC may for example be iteratively adjusted until it matches a first delay corresponding to the first sub-ADC being the reference sub-ADC in the described example.

In further implementations, the interleaving ADC comprises a set of at least three sub-ADCs, the set including the first and the second sub-ADC. The second sub-ADC is operated in a calibration mode of operation and the remaining sub-ADCs of the set of sub-ADCs are operated in a productive mode of operation during periods when the programmable delay element generates the second calibrated sub-clock signal, when the second sub-ADC converts the second calibration signal into the second calibration code and when the timing control unit generates the control signal.

Figure 1:
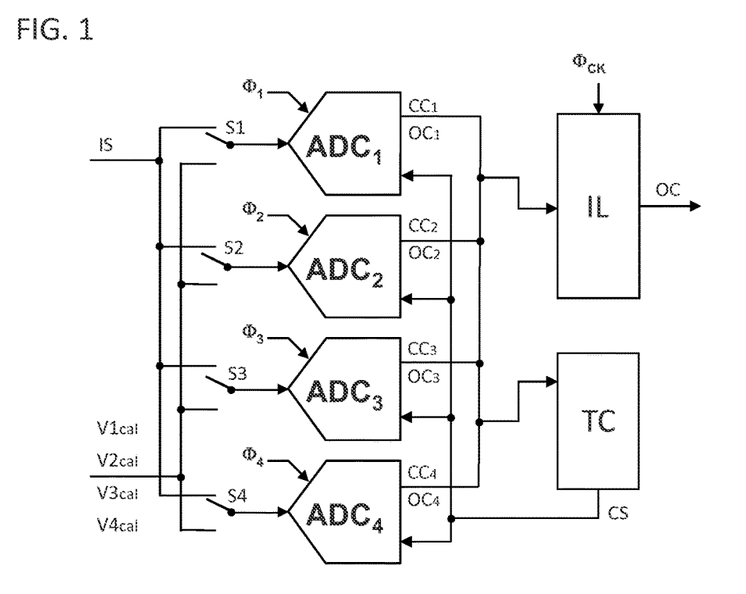
FIG. 1 shows an exemplary implementation of an interleaved ADC according to the improved concept.

When the remaining sub-ADCs are operated in the productive mode of operation they contribute to an analog-to-digital conversion of the analog input signal into the digital output code according to a known concept of interleaved analog-to-digital conversion. Such a concept may for example include a sampling of the input signal by each of the remaining sub-ADCs in sequence at a sub-ADC rate, thereby generating samples of the input at an ADC conversion rate which is for example given by the sub-ADC rate multiplied by the number of remaining sub-ADCs being operated in the productive mode of operation (see also FIG. 1B and the respective description). When the second sub-ADC is operated in the calibration mode it may for example not contribute to the analog-to-digital conversion of the analog input signal into the digital output code.

According to some implementations of the interleaved ADC, the second sub-ADC is operated in the calibration mode for a number of N' clock periods of a reference clock signal and then is operated in the productive mode, wherein N' is equal to a sum of a number N being the total number of sub-ADCs comprised by the set of sub-ADCs and a number R being a positive integer number or zero.

In some implementations of the interleaved ADC, the number R is equal to zero and the second sub-ADC is operated in the productive mode for $N*(N-1)$ clock periods of the reference clock signal after being operated in the calibration mode for the number of N' clock periods of the reference clock signal.

In alternative implementations of the interleaved ADC the number R is a random number within an interval of positive integer numbers or within an interval between zero and a positive integer number.

According to the improved concept, also a circuit description is provided, the circuit description representing an interleaved ADC according to one of the described implementations. The circuit description may for example be stored on a memory device and be used in a design tool, in particular in an Electronic Design Automation tool.

According to the improved concept, also a method for calibrating an interleaved ADC is provided. The method comprises steps of providing a first calibration signal and a first sub-clock signal to a first sub-ADC comprised by the interleaved ADC and providing a second calibration signal and a second sub-clock signal to a second sub-ADC comprised by the interleaved ADC. The method further comprises generating a calibrated second sub-clock signal by shifting a phase of the second sub-clock signal by a delay depending on a control signal. Furthermore, the method comprises converting the first calibration signal to a first calibration code by means of the first sub-ADC depending on the first sub-clock signal and converting the second calibration signal to a second calibration code by means of the second sub-ADC depending on the calibrated second sub-clock signal. The method also comprises generating the control signal based on a comparison of the second calibration code to the first calibration code and adjusting the delay depending on the control signal.

In some implementations of the method, the first and the second calibration signal are time shifted versions of a calibration signal, shifted by a first and a second time shift with respect to the calibration signal, respectively. Therein, the first and the second time shift are given by integer multiples of a clock period of a reference clock signal, for example of a sampling clock signal of the interleaved ADC.

According to some implementations of the method, the first and the second calibration signal are represented by an increasing voltage ramp. In such an implementation the timing control unit is configured to generate the control signal such that it causes the delay element to increase the delay if a value represented by the second calibration code is smaller than a value represented by the first calibration code. Furthermore, the timing control unit is configured to generate the control signal such that it causes the delay element to reduce the delay if the value represented by the second calibration code is larger than the value represented by the first calibration code.

In alternative implementations of the method, the first and the second calibration signal are represented by a decreasing voltage ramp. In such an implementation the timing control unit is configured to generate the control signal such that it causes the delay element to reduce the delay if the value represented by the second calibration code is smaller than the value represented by the first calibration code. Furthermore, the timing control unit is configured to generate the control signal such that it causes the delay element to increase the delay if the value represented by the second calibration code is larger than the value represented by the first calibration code.

In some implementations of the method, the first and second calibration signal represent strictly increasing or strictly decreasing functions of time.

In some implementations of the method the steps of generating the calibrated second sub-clock signal, converting the second calibration signal to the second calibration code, generating the control signal and adjusting the second delay are carried out consecutively for a defined number of times. Alternatively said steps may for example be carried out consecutively until the second calibration code and the first calibration code are identical up to a threshold.

In several implementations of the method the first and the second sub-ADC are comprised by a set of at least three sub-ADCs. In such an implementation the second sub-ADC is operated in a calibration mode of operation during the steps of providing the second calibration signal, generating the calibrated second sub-clock signal, converting the second calibration signal to the second calibration code, generating the control signal and adjusting the delay. During said steps, the remaining sub-ADCs of the set of sub-ADCs are operated in a productive mode of operation.

In some implementations of the method the second sub-ADC is operated in the calibration mode for a number of N' clock periods of a reference clock signal and then is operated in the productive mode, wherein N' is equal to a sum of a number N being the total number sub-ADCs comprised by the set of sub-ADCs and a number R being a positive integer number or zero.

In some implementations of the method the number R is equal to zero and the second sub-ADC is operated in the productive mode for N*(N−1) cycles of the clock generator after being operated in the calibration mode for the number of N' cycles of the clock generator.

For example, after a method for calibrating an interleaved ADC according to the improved concept has been carried out, residual mismatches may remain. Such mismatches may for example cause an output pattern or spurs for example in a frequency spectrum of the digital output code for example due to a periodic rotating process in the background calibration.

In some implementations of the method the background calibration process just described may further be improved for example by waiting for example for a random number of cycles of the clock generator before starting the calibration of a next sub-ADC according to the improved concept. In such an implementation the number R is a random number within an interval of positive integer numbers or within an interval between zero and a positive integer number. The interval may for example be 0, 1, 2 or another interval. This may for example effectively break a periodicity of the sampling sequence and spread an energy of the spurs into a noise floor, further improving the SFDR. This may hold not only for spurs due to phase mismatches but also for spurs of different origin, for example of gain mismatches and offset mismatches.

According to the improved concept, also a circuit description is provided, the circuit description representing an electronic circuit carrying out one of the described methods according to the improved concept. The circuit description may for example be stored on a memory device and be used in a design tool, in particular in an Electronic Design Automation tool.

Further embodiments and implementations of the interleaved ADC are readily derived from the various implementations and embodiments of the method and vice versa. Additionally, the described implementations and embodiments may be split and/or combined to achieve further implementations and embodiments that may be suitable or particularly suitable for specific applications.

Example ADC

FIG. 1 shows an exemplary implementation of an interleaved ADC according to the improved concept. The ADC comprises a set of four sub-ADCs $ADC_1$, $ADC_2$, $ADC_3$, $ADC_4$, an interleaver unit IL and a timing control unit TC. The interleaver unit IL is coupled to respective outputs of the sub-ADCs $ADC_1$, $ADC_2$, $ADC_3$, $ADC_4$. The timing control unit TC is also coupled to the respective outputs of the sub-ADCs $ADC_1$, $ADC_2$, $ADC_3$, $ADC_4$ and is further coupled to respective control inputs of the sub-ADCs $ADC_1$, $ADC_2$, $ADC_3$, $ADC_4$. The sub-ADCs $ADC_1$, $ADC_2$, $ADC_3$, $ADC_4$ receive respective sub-clock signals $\Phi_1$, $\Phi_2$, $\Phi_3$, $\Phi_4$ at respective clock inputs. At the respective outputs the sub-ADCs, $ADC_1$, $ADC_2$, $ADC_3$, $ADC_4$ may provide, for example, respective digital calibration codes $CC_1$, $CC_2$, $CC_3$, $CC_4$ to the timing control unit TC or for example respective digital output codes $OC_1$, $OC_2$, $OC_3$, $OC_4$ to the interleaver unit IL, depending for example on a mode of operation.

The timing control unit TC generates a control signal CS and supplies it to the respective control inputs of the sub-ADCs $ADC_1$, $ADC_2$, $ADC_3$, $ADC_4$. Furthermore, the interleaver unit IL receives a sample clock signal $\Phi_{CK}$ from a clock generator (not shown). At respective signal inputs the sub-ADCs $ADC_1$, $ADC_2$, $ADC_3$, $ADC_4$ may, for example, receive respective analog calibration signals $V1_{cal}$, $V2_{cal}$, $V3_{cal}$, $V4_{cal}$ or an analog input signal IS, depending on the mode of operation. To this end, the interleaved ADC comprises input switches S1, S2, S3, S4 to select either the calibration signals $V1_{cal}$, $V2_{cal}$, $V3_{cal}$, $V4_{cal}$ or the input signal IS to be supplied. The interleaver unit IL is configured to generate an output code OC depending on the respective output codes $OC_1$, $OC_2$, $OC_3$, $OC_4$ and the sample clock signal $\Phi_{CK}$.

In the depicted implementation the calibration signals $V1_{cal}$, $V2_{cal}$, $V3_{cal}$, $V4_{cal}$ are for example all supplied by a common supply line and generated by a common source. The common supply line in a sense supplies a common signal. The calibration signals $V1_{cal}$, $V2_{cal}$, $V3_{cal}$, $V4_{cal}$ then correspond to the common signal during respective time periods. For example, the calibration signals $V1_{cal}$, $V2_{cal}$, $V3_{cal}$, $V4_{cal}$ may all be generated in the same way, in particular by the common source. Consequently, the calibration signals $V1_{cal}$, $V2_{cal}$, $V3_{cal}$, $V4_{cal}$ may feature the same variation in time except for a time shift with respect to each other. In particular, the timing control unit TC may be configured and arranged to control the generation of the common signal such that the calibration signals $V1_{cal}$, $V2_{cal}$, $V3_{cal}$, $V4_{cal}$ match corresponding sampling instants of the sub-ADCs $ADC_1$, $ADC_2$, $ADC_3$, $ADC_4$, respectively.

The clock generator generates, on the one hand, the sample clock signal $\Phi_{CK}$, but for example also generates the respective sub-clock signals $\Phi_1$, $\Phi_2$, $\Phi_3$, $\Phi_4$, for example by deriving them from the sample clock signal $\Phi_{CK}$. For example, the clock generator may comprise a clock divider to derive the sub-clock signals $\Phi_1$, $\Phi_2$, $\Phi_3$, $\Phi_4$ from the sample clock signal $\Phi_{CK}$. In a preferred embodiment the clock generator may use a clock divider and a multiplexer which is coupled downstream from the clock divider to generate the sub-clock signals $\Phi_1$, $\Phi_2$, $\Phi_3$, $\Phi_4$. The clock generator may, for example, also comprise further components, for example buffers, logic gates or other internal processing elements.

The sub-ADCs $ADC_1$, $ADC_2$, $ADC_3$, $ADC_4$ are for example configured to be operated in a calibration mode of operation or in a productive mode of operation. When one of the sub-ADCs $ADC_1$, $ADC_2$, $ADC_3$, $ADC_4$ is operated in the productive mode of operation it converts for example the analog input signal IS into the respective one of the digital output codes $OC_1$, $OC_2$, $OC_3$, $OC_4$. To this end, a known technique of analog-to-digital conversion may be used.

When one of the sub-ADCs $ADC_1$, $ADC_2$, $ADC_3$, $ADC_4$, for the sake of clarity the second sub-ADC $ADC_2$ is considered here, is operated in the calibration mode of operation it converts for example the respective one of the analog calibration signals $V1_{cal}$, $V2_{cal}$, $V3_{cal}$, $V4_{cal}$, namely in the present example the second calibration signal $V2_{cal}$, into the second calibration code $CC_2$ depending on the second sub-clock signal $\Phi_2$ according to the improved concept. Then the timing control unit compares for example the second calibration code $CC_2$ to a reference code. The reference code may for example be given by the first calibration code $CC_1$. In this case, the first calibration code may have been generated for example during a previous time period where the first sub-ADC $ADC_1$ has been operated in the calibration mode of operation by converting the first calibration signal $V1_{cal}$ into the first calibration code $CC_1$ depending on the first sub-clock signal $\Phi_1$. Depending on the comparison, the timing control unit TC generates the control signal CS and provides it to the second sub-ADC $ADC_2$. Depending on the control signal CS, the second sub-ADC $ADC_2$ then may for example adjust the second sub-clock signal $\Phi_2$ such that a possible mismatch between the first and the second calibration code $CC_1$, $CC_2$ is reduced. Further details are provided below with respect to FIG. 3.

It is highlighted that the choice of the first and the second sub-ADC $ADC_1$, $ADC_2$ in the description is for explanatory reasons only. In an analog way the first and the second sub-ADC $ADC_1$, $ADC_2$ may be interchanged with any of the sub-ADCs $ADC_1$, $ADC_2$, $ADC_3$, $ADC_4$. In preferred embodiments, the sub-ADC generating the reference code, in the above example the first sub-ADC $ADC_1$, may remain the same during the operation of the interleaved ADC. In particular, the same reference code may be used for all sub-ADCs $ADC_1$, $ADC_2$, $ADC_3$, $ADC_4$ except the reference sub-ADC. That is it may be used for all of the respective sub-clock signals $\Phi_1$, $\Phi_2$, $\Phi_3$, $\Phi_4$ except for the one corresponding to the reference sub-ADC to be adjusted for example in the described way. In alternative embodiments, the reference sub-ADC may also change during operation.

Sampling

Figure 2:
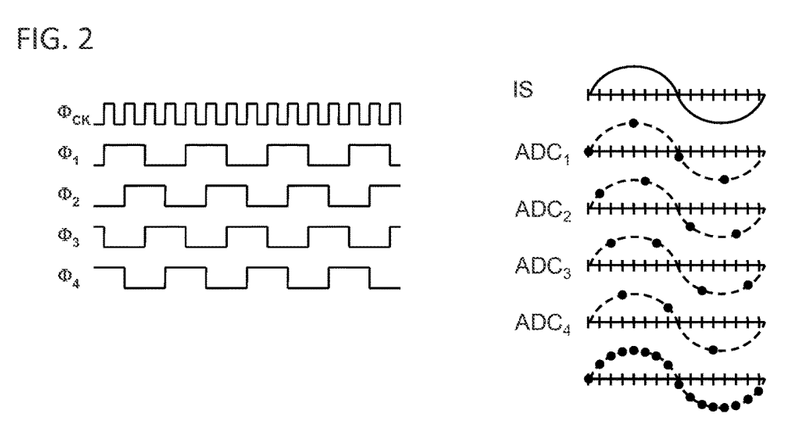
FIG. 2 sketches a principle for sampling an input signal on an interleaved ADC.

FIG. 2 shows a principle for sampling an input signal on an interleaved ADC, for example an interleaved ADC according to the improved concept. On the left side of FIG. 2 an exemplary implementation for the sample clock signal $\Phi_{CK}$ and corresponding sub-clock signals $\Phi_1$, $\Phi_2$, $\Phi_3$, $\Phi_4$ are shown. In the shown example the sub-clock signals $\Phi_1$, $\Phi_2$, $\Phi_3$, $\Phi_4$ are rectangular signals featuring a sub-ADC rate, while the sample clock signal $\Phi_{CK}$ is a rectangular signal featuring a conversion rate that is four times larger than the sub-ADC rate. By operating the sub-ADCs $ADC_1$, $ADC_2$, $ADC_3$, $ADC_4$ in an interleaved fashion it becomes possible to convert the input signal IS at the conversion rate, even though each of the sub-ADCs $ADC_1$, $ADC_2$, $ADC_3$, $ADC_4$ may for example only be capable of converting at the sub-ADC rate. As displayed on the right side of FIG. 2, in the shown example, the first sub-ADC $ADC_1$ samples the input signal at a first, a fifth, a ninth, and a thirteenth cycle of the clock signal. The second sub-ADC $ADC_2$ samples the analog input signal IS at a second, a sixth, a tenth and a fourteenth cycle of the sample clock signal $\Phi_{CK}$. In an analog way the sampling instances of the remaining sub-ADCs $ADC_3$, $ADC_4$ are shifted by one cycle of the clock signal with respect to the preceding sub-ADC, respectively. In this way the input signal IS is sampled during each cycle of the clock signal $\Phi_{CK}$.

It is pointed out that a sampling principle as in FIG. 2 may be suitable for some implementations and may not be suitable for other implementations of an interleaved ADC according to the improved concept. In particular, the shown sampling may be suitable if a calibration according to the improved concept is carried out at a start-up phase of the interleaved ADC. For other implementations, in particular when the calibration is carried out as a background process, as for example explained with respect to FIGS. 3, 4A and 4B, the sampling scheme may have to be adapted. Such an adaption is evident for the skilled reader in view of the explanations of the present manuscript, in particular in view of the explanations with respect to FIGS. 3, 4A and 4B.

Example Implementation of Sub-ADC

Figure 3:
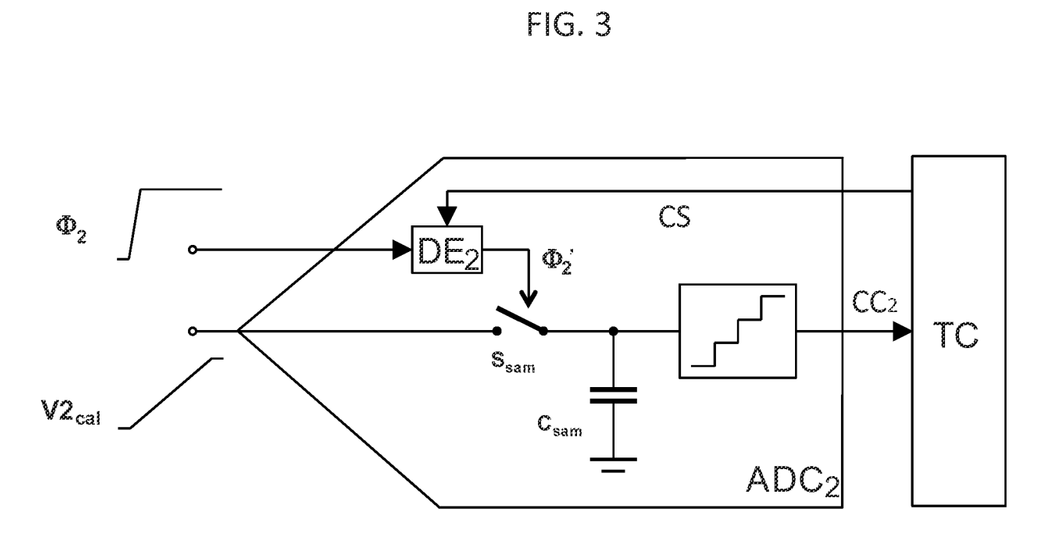
FIG. 3 shows an exemplary implementation of a sub-ADC of an interleaved ADC according to the improved concept.

FIG. 3 shows an exemplary implementation of a sub-ADC of an interleaved ADC according to the improved concept as shown for example in FIG. 1. In the present case, the second sub-ADC $ADC_2$ is shown, but in general the remaining sub-ADCs may for example be implemented in the same way. The second sub-ADC $ADC_2$ comprises a signal input that is coupled to a second sample capacitor $C_{sam}$ via a second sample switch $S_{sam}$. The second sub-ADC $ADC_2$ further comprises a delay element $DE_2$ that is coupled to a control terminal of the second sample switch $S_{sam}$ and is configured to open and close the second sample switch $S_{sam}$. The delay element $DE_2$ is also coupled to the clock input of the second sub-ADC $ADC_2$ to receive the second sub-clock signal $\Phi_2$. The second calibration signal $V2_{cal}$ is supplied at the signal input of the second sub-ADC $ADC_2$ that is coupled to the second sample switch $S_{sam}$. The delay element $DE_2$ is further coupled to the control input of the second sub-ADC $ADC_1$ via which the latter is coupled to the timing control unit TC to receive the control signal CS. The delay element $DE_2$ is further configured to generate a calibrated second sub-clock signal $\Phi_2'$ by shifting a phase of the second sub-clock signal $\Phi_2$ by a delay depending on the control signal CS. Above mentioned opening and closing of second sample switch $S_{sam}$ is carried out depending on the calibrated second sub-clock signal $\Phi_2'$. The second sub-ADC $ADC_2$ also comprises an output that is coupled to the timing control unit TC to provide for example the second calibration code $CC_2$.

The second sub-ADC $ADC_2$ is configured to be operated in the calibration mode of operation. When operated in the calibration mode the second calibration signal $V2_{cal}$, which is an increasing voltage ramp in the shown example, in particular a fast increasing voltage ramp, is applied to the signal input of the second sub-ADC $ADC_2$. In other implementations the second calibration signal $V2_{cal}$ may also be for example a decreasing voltage ramp or a non-linearly strictly increasing or strictly decreasing voltage signal. The second sub-clock signal $\Phi_2$ is applied to the clock input of the second sub-ADC $ADC_2$. The second calibration signal $V2_{cal}$ is applied to the signal input synchronously with the sampling clock signal $\Phi_{CK}$. The delay element $DE_2$ then causes the second sample switch $S_{sam}$ to close via the calibrated second sub-clock signal $\Phi_2'$ and consequently a voltage gets sampled on the second sampling capacitor $C_{sam}$.

The voltage, or in other words the charge, that is sampled on the second sample capacitor $C_{sam}$ depends on an internal delay in the clock circuit, i.e. for example in the clock generator, for example in the generation of the second clock signal $\Phi_2$. Furthermore, said voltage or charge depends for example on the second calibration signal $V2_{cal}$, on the second sub-clock signal $\Phi_2$ and on the calibrated second sub-clock signal $\Phi_2'$ via the delay. When the value of the calibrated second sub-clock signal $\Phi_2'$ has dropped to zero again, the second sample switch $S_{sam}$ opens again and the voltage sampled on the second sampling capacitor $C_{sam}$ remains for example constant or nominally constant. Then the second sub-ADC $ADC_2$ converts the sampled voltage into a digital code, in particular into the second calibration code $CC_2$. The second calibration code $CC_2$ is provided to the timing control unit TC. The timing control TC unit then compares the second calibration code $CC_2$ to a reference calibration code. The reference calibration code is for example given by the first calibration code $CC_1$, which is an output of a reference sub-ADC. In the described example the reference sub-ADC is given by the first sub-ADC $ADC_1$. However, any of the remaining sub-ADCs $ADC_1$, $ADC_3$, $ADC_4$ may be used as a reference sub-ADC.

Based on the comparison, the timing control unit TC generates the control signal CS and provides it to the delay element $DE_2$. The delay element $DE_2$ is configured to adjust the delay by which the phase of the second sub-clock signal $\Phi_2$ is shifted for example in a subsequent clock cycle depending on the control signal CS. In particular the delay element $DE_2$ is configured to either increase or reduce the second delay depending on the control signal CS. The first calibration code $CC_1$ is generated by the first sub-ADC $ADC_1$ by converting the first calibration signal $V1_{cal}$ depending on the first sub-clock signal $\Phi_1$ and for example a reference delay. To this end for example a first delay element (not shown) comprised by the first sub-ADC $ADC_1$ may shift a phase of the first sub-clock signal $\Phi_1$ by a fixed reference delay. The reference delay may for example be chosen as a mid-scale value of a range available for the first delay element.

In preferred implementations, the second calibration signal $V2_{cal}$ and the first calibration signal $V1_{cal}$ are time shifted versions of a calibration signal $V_{cal}$ shifted by a first and a second time shift with respect to the calibration signal $V_{cal}$, respectively. It is pointed out that this does not mean that the first and the second calibration signal $V1_{cal}$, $V2_{cal}$ are generated by for example delaying the calibration signal $V_{cal}$. Rather, the time dependence described by the calibration signal $V_{cal}$ determines, in particular is up to the first and the second time shift equal to, the time dependences of the first and the second calibration signal $V1_{cal}$, $V2_{cal}$. The first and the second calibration signal $V1_{cal}$, $V2_{cal}$ are for example supplied by a common supply line and generated by a common source, as explained earlier.

The first and the second time shift are for example given by integer multiples of the period of the sample clock signal $\Phi_{CK}$. In particular the first and the second time shift may result in a time shift between the second calibration signal $V2_{cal}$ and the first calibration signal $V1_{cal}$ matching a time interval between different rising edges of the sampling clock signal.

In this way, the first and the second calibration signal $V1_{cal}$, $V2_{cal}$ are effectively equal.

Consequently, if in the example of FIG. 3, where the calibration signal $V_{cal}$ is an increasing voltage ramp, a value corresponding to the second calibration code $CC_2$ is smaller than a value corresponding to the first calibration code $CC_1$, the second sample switch has for example been deactivated too early. Therefore, the control signal CS is generated by the timing control unit TC such that the delay element $DE_2$ increases the delay by which the second sub-clock signal $\Phi_2$ is shifted resulting in the calibrated second sub-clock signal $\Phi_2'$. In the opposite case of the value corresponding to the second calibration code $CC_2$ being larger than the value corresponding to the first calibration code $CC_1$, the second sample switch has for example been deactivated too late and consequently the timing control unit TC generates the control signal CS such that the delay element $DE_2$ reduces the delay.

By periodically performing an adjustment as just described, the delay and consequently the calibrated second sub-clock signal $\Phi_2'$ may for example be iteratively adjusted until the first and the second calibration code $CC_1$, $CC_2$ match. It is highlighted that "matching" does here not necessarily mean that the delay is exactly identical to the reference delay. Rather, it means that the first and the second calibration code $CC_1$, $CC_2$ are identical or nominally identical or identical up to an acceptable deviation. Such a difference may for example be due to internal and/or production deviations.

In the described way the second sub-ADC $ADC_2$ is effectively calibrated to the first sub-ADC $ADC_1$. This may, for example, reduce spurs in the output code OC caused by phase, or timing, mismatches. In the presented implementation the reference is selected to be the first sub-ADC $ADC_1$ that is, for example, implemented in the same way as the second sub-ADC $ADC_2$. The first delay element of the first sub-ADC $ADC_1$ is, for example, set to a mid-scale value prior to the calibration process. The setting may for example remain unchanged during operation, however, the actual delay related to the first sub-ADC $ADC_1$ may anyway undergo changes during operation due to external effects such as, for example, temperature effects or variations in the input signal. Such changes, however, do not influence a calibration method according to the improved concept. In such a setup of an interleaved ADC all sub-ADCs except for the reference sub-ADC, in the present example the first sub-ADC $ADC_1$, may be calibrated in the same way as described here for the second sub-ADC $ADC_2$.

Such a calibration process may, for example, be carried out at a start-up phase of the interleaved ADC. However subsequent variations, for example of the supply voltage or of temperature, may affect timing matching. Therefore, in order to allow a background calibration during normal operation of the interleaved ADC, an additional sub-ADC $ADC_5$ may, for example, be included in the setup. In this way it may for example be achieved that there is always one spare sub-ADC available to be calibrated while the remaining sub-ADCs are operated in a productive mode of operation, as shown for example in FIG. 4A. The spare sub-ADC which is being calibrated is then rotated for a long time to allow all sub-ADCs $ADC_1$, $ADC_2$, $ADC_3$, $ADC_4$, $ADC_5$ to be calibrated.

Example Calibration Process

Figure 4A:
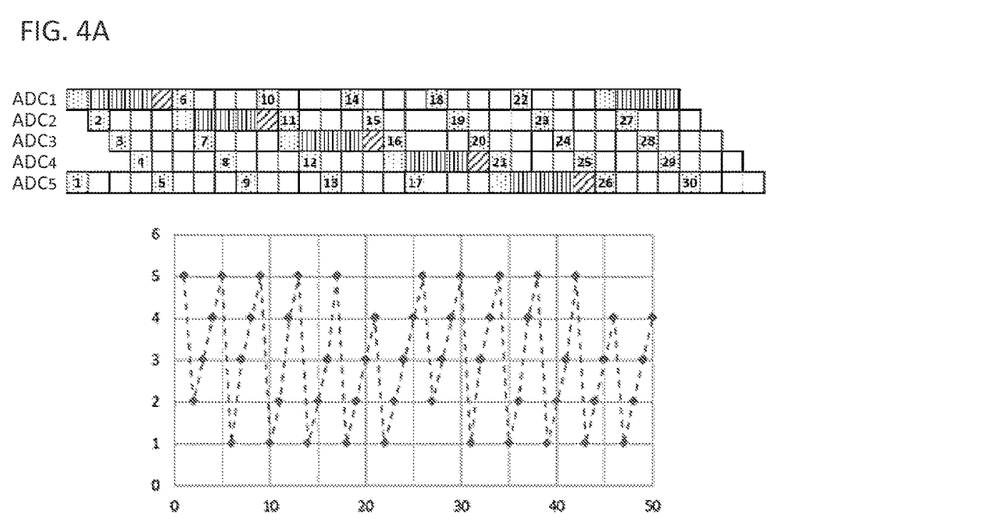
FIG. 4A illustrates an exemplary implementation of a method for calibrating an interleaved ADC according to the improved concept.

FIG. 4A illustrates an exemplary implementation of a method for calibrating an interleaved ADC according to the improved concept. In the shown implementation a spare sub-ADC is comprised by the interleaved ADC in order to allow a background calibration of the sub-ADCs $ADC_1$, $ADC_2$, $ADC_3$, $ADC_4$, $ADC_5$. This means that in the method shown in FIG. 4A, four sub-ADCs are operated in a productive mode of operation in an interleaved fashion during each cycle of the clock signal $\Phi_{CK}$. A fifth sub-ADC is operated in a calibration mode of operation at the each cycle of the clock signal $\Phi_{CK}$. This is illustrated by the table in the top part of FIG. 4A. Each square represents a cycle of the sample clock signal $\Phi_{CK}$ and each line of the table corresponds to a respective one of the sub-ADCs $ADC_1$, $ADC_2$, $ADC_3$, $ADC_4$, $ADC_5$. All blank squares and all squares with a number inside indicate that the respective sub-ADC is operated in the productive mode during the corresponding cycle. Furthermore, all squares with vertical lines, diagonal lines or being dotted but not containing a number, indicate that the respective sub-ADC is operated in the calibration mode during the corresponding cycle.

The dotted background of a square indicates that in the corresponding cycle of the sample clock signal $\Phi_{CK}$ a voltage is sampled on the respective sub-ADC. When the respective sub-ADC is operated in the productive mode of operation during the sampling, that is the square contains a dotted background and a number from 1 to 30, the voltage being sampled corresponds to the analog input signal IS. In particular, it corresponds to the analog input signal IS at the corresponding cycle of the sample clock signal $\Phi_{CK}$. On the other hand if the respective sub-ADC is operated in the calibration mode during the sampling, that is the square contains a dotted background but no number, the sampled voltage corresponds to a respective one of calibration signals $V1_{cal}$, $V2_{cal}$, $V3_{cal}$, $V4_{cal}$, $V5_{cal}$. The blank squares represent cycles of the sample clock signal $\Phi_{CK}$ during which the respective sub-ADC converts the analog input signal IS into a respective one of output codes $OC_1$, $OC_2$, $OC_3$, $OC_4$, $OC_5$. Squares with vertical lines indicate that the respective sub-ADC converts the respective one of the calibration signals $V1_{cal}$, $V2_{cal}$, $V3_{cal}$, $V4_{cal}$, $V5_{cal}$ into the respective one of the calibration codes $CC_1$, $CC_2$, $CC_3$, $CC_4$, $CC_5$ being evaluated by the timing control unit TC. Squares with diagonal lines may for example indicate processing cycles during which calibration results are processed. In the example of FIG. 4A, a respective sub-ADC is operated in the calibration mode for five cycles comprising one sampling cycle (dotted) three conversion cycles (vertical lines) and one processing cycle (diagonal lines).

As described for example with respect to FIG. 1, also the calibration signals $V1_{cal}$, $V2_{cal}$, $V3_{cal}$, $V4_{cal}$, $V5_{cal}$ are for example all supplied by a common supply line and generated by a common source. The calibration signals $V1_{cal}$, $V2_{cal}$, $V3_{cal}$, $V4_{cal}$, $V5_{cal}$ then correspond to the common signal during respective time periods. For example, the calibration signals $V1_{cal}$, $V2_{cal}$, $V3_{cal}$, $V4_{cal}$, $V5_{cal}$ may all be generated in the same way, in particular by the common source. Consequently, the calibration signals $V1_{cal}$, $V2_{cal}$, $V3_{cal}$, $V4_{cal}$, $V5_{cal}$ may feature the same variation in time except for a time shift with respect to each other.

The generation of the control signal CS and the consequent adjustment for example of a respective delay by one of the sub-ADCs $ADC_1$, $ADC_2$, $ADC_3$, $ADC_4$, $ADC_5$, for example of the delay by the second sub-ADC $ADC_2$, may for example be carried out during a processing cycle. However, such an adjustment is not necessarily carried out during every processing cycle. This may particularly be the case for processing cycles corresponding of the reference sub-ADC, for example the first sub-ADC $ADC_1$.

As described earlier, the calibration is based on a comparison of a calibration code, for example the second calibration code $CC_2$ to a reference calibration code generated by the reference sub-ADC, for example the first calibration code $CC_1$. Since in an implementation as shown in FIG. 4A, the reference sub-ADC may generate the reference calibration code several times, for example, the first sub-ADC $ADC_1$ may generate the first calibration code $CC_1$ in the first shown cycle and in the $26^{th}$ shown cycle, alternatives to said comparison may be implemented. For example, instead of comparing for example the second calibration code $CC_2$ to for example the first calibration code $CC_1$ generated in the first shown cycle, the second calibration code $CC_2$ may also be compared to the first calibration code $CC_1$ generated in the 26th shown cycle or to an average of earlier generated reference calibration codes. In this way, the reference calibration code may also for example vary during the operation of the interleaved ADC.

In the implementation of FIG. 4A, the reference sub-ADC may for example remain the same, for example the first sub-ADC $ADC_1$, during the operation of the interleaved ADC. In other embodiments, however, the reference sub-ADC may also change during operation.

In diagram in the lower part of FIG. 4A, the method is illustrated in an alternative way. The horizontal axis represents the number of the sampling instance. The numbers 1, 2, 3, 4 and 5 on the vertical axis represent the sub-ADCs $ADC_1$, $ADC_2$, $ADC_3$, $ADC_4$, $ADC_5$, respectively. Each entry (small squares) indicates which of the sub-ADCs $ADC_1$, $ADC_2$, $ADC_3$, $ADC_4$, $ADC_5$ is performing the respective conversion of the analog input signal IS to the digital output code OC being operated in the productive mode. One can for example see that the dashed line has a periodicity of twenty-five cycles.

For specific applications or under certain circumstances, residual timing mismatches in combination with said periodicity may for example cause an output pattern or spurs for example in a frequency spectrum of the digital output code OC.

Figure 4B:
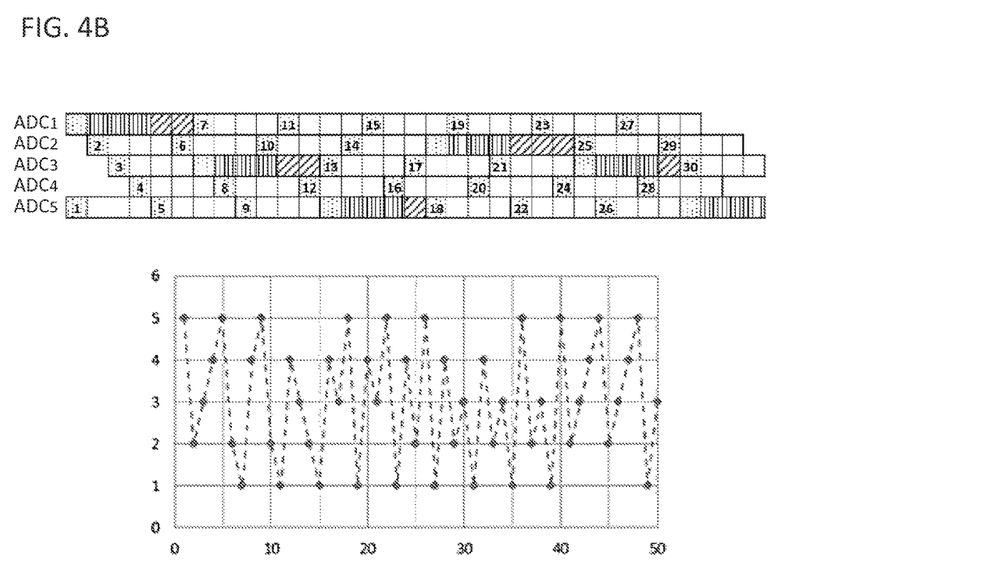
FIG. 4B illustrates a further exemplary implementation of a method for calibrating an interleaved ADC according to the improved concept.

FIG. 4B shows an example of an implementation of a method for calibrating an interleaved ADC according to the improved concept where such spurs may for example be further reduced.

The dotted squares, the blank squares and the squares with vertical lines have the same meaning in the table at the top part of FIG. 4B as explained with respect to FIG. 4A. In FIG. 4B, however, the squares with diagonal lines may for example either indicate processing cycles during which calibration results are processed or may for example indicate waiting cycles during which the respective sub-ADC idles. In the example of FIG. 4B, a respective sub-ADC is in calibration mode for five to seven cycles comprising one sampling cycle (dotted) three conversion cycles (vertical lines), one processing cycle (diagonal lines) and between zero and two waiting cycles (diagonal lines). The number of waiting cycles may for example be chosen randomly between zero and two. In other implementations, the number of waiting cycles may for example be chosen, in particular be chosen randomly, between zero another positive integer number or between two other integer numbers. The number of waiting cycles plus the processing cycle for each time a sub-ADC is operated in the calibration mode corresponds to the number R discussed earlier.

In diagram in the lower part of FIG. 4B the periodicity of the dashed line is effectively broken.

Such introduction of a random number of waiting cycles may for example effectively break said periodicity of the sampling sequence and spread an energy of the spurs into the noise floor, improving the SFDR.

The described implementations of the interleaved ADC and the method for calibrating an interleaved ADC provide an improved concept for analog-to-digital conversion utilizing an interleaved ADC. In particular, they may be used to achieve an improved phase matching or timing matching, respectively.

Advantages of the improved concept may for example include an improved SNR and SFDR in broadband high speed ADCs. The described implementations include a self-referenced calibration requiring no accurate external signals. Furthermore a simple digital processing block may sufficient. The described implementations may also feature an independence of input signal properties, a fast startup calibration, and a background process to track sampling timing fluctuations caused by supply voltage or temperature variations.

What is claimed is:

1. An interleaved analog-to-digital converter (ADC) comprising:
    a first sub-ADC configured to convert a first calibration signal into a first calibration code depending on a first sub-clock signal;
    a second sub-ADC comprising a programmable delay element configured to:
        generate a calibrated second sub-clock signal by shifting a phase of a second sub-clock signal by a delay depending on a control signal, and
        convert a second calibration signal into a second calibration code depending on the calibrated second sub-clock signal; and
    a timing control unit configured to generate the control signal based on a comparison of the second calibration code to the first calibration code,
    wherein the first and the second calibration signals are time shifted versions of a calibration signal shifted by a first and a second time shift with respect to the calibration signal, respectively; and
    the first and the second time shift are given by integer multiples of a clock period of a reference clock signal.

2. The interleaved ADC according to claim 1, further comprising a control unit configured to trigger the first sub-ADC to convert the first calibration signal into a first calibration code depending on a first sub-clock signal, the second sub-ADC to convert the second calibration signal into a second calibration code depending on the calibrated second sub-clock signal and the timing control unit to generate the control signal based on the comparison of the second calibration code to the first calibration code consecutively until the second calibration code and the first calibration code are identical up to a threshold.

3. The interleaved ADC according to claim 1, wherein the first and the second calibration signal are represented by increasing voltage ramps and wherein the timing control unit is configured to generate the control signal such that it causes the delay element to:
    increase the delay if a value represented by the second calibration code is smaller than a value represented by the first calibration code, and
    reduce the delay if the value represented by the second calibration code is larger than the value represented by the first calibration code.

4. The interleaved ADC according to claim 1, wherein the first and the second calibration signal are represented by decreasing voltage ramps and wherein the timing control unit is configured to generate the control signal such that it causes the delay element to:
    reduce the delay if a value represented by the second calibration code is smaller than a value represented by the first calibration code, and
    increase the delay if the value represented by the second calibration code is larger than the value represented by the first calibration code).

5. The interleaved ADC according to claim 1, wherein the first and the second calibration signal represent strictly increasing or strictly decreasing functions of time.

6. The interleaved ADC according to claim 1, further comprising a control unit configured to trigger the first sub-ADC to convert the first calibration signal into the first calibration code depending on the first sub-clock signal, the second sub-ADC to convert the second calibration signal into the second calibration code depending on the calibrated second sub-clock signal and the timing control unit to generate the control signal based on the comparison of the second calibration code to the first calibration code consecutively for a defined number of times.

7. The interleaved ADC according to claim 1 comprising a set of at least three sub-ADCs that includes the first and the second sub-ADC and wherein the second sub-ADC is operated in a calibration mode of operation and the remaining of the set of sub-ADCs are operated in a productive mode of operation in response to:
    the programmable delay element generating the calibrated second sub-clock signal,
    the second sub-ADC converting the second calibration signal into the second calibration code, and
    the timing control unit generating the control signal.

8. The interleaved ADC according to claim 7, wherein the second sub-ADC is operated in the calibration mode for a number of N' clock periods of a reference clock signal and then is operated in the productive mode, wherein N' is equal to a sum of a number N being the total number of sub-ADCs comprised by the set of sub-ADCs and a number R being a positive integer number or zero.

9. The interleaved ADC according to claim 8, wherein the number R is a random number within an interval of positive integer numbers or within an interval between zero and a positive integer number.

10. The interleaved ADC according to claim 8, wherein the number R is equal to zero and wherein the second sub-ADC is operated in the productive mode for N*(N−1) clock periods of the reference clock signal after being operated in the calibration mode for the number of N' clock periods of the reference clock signal.

11. A method for calibrating an interleaved analog-to-digital converter (ADC), the method comprising:
    providing a first calibration signal and a first sub-clock signal to a first sub-ADC of the interleaved ADC;
    providing a second calibration signal and a second sub-clock signal to a second sub-ADC of the interleaved ADC;
    generating a calibrated second sub-clock signal by shifting a phase of the second sub-clock signal by a delay depending on a control signal;
    converting the first calibration signal to a first calibration code by means of the first sub-ADC depending on the first sub-clock signal;

converting the second calibration signal to a second calibration code by means of the second sub-ADC depending on the calibrated second sub-clock signal;

generating the control signal based on a comparison of the second calibration code to the first calibration code; and adjusting the delay depending on the control signal, wherein the first and the second calibration signal are time shifted versions of a calibration signal shifted by a first and a second time shift with respect to the calibration signal, respectively; and the first and the second time shift are given by integer multiples of a clock period of a reference clock signal.

12. The method according to claim 11, wherein the first and the second calibration signal are represented by an increasing voltage ramp and wherein the adjusting of the delay comprises:

increasing the delay if a value represented by the second calibration code is smaller than a value represented by the first calibration code; and reducing the delay if the value represented by the second calibration code is larger than the value represented by the first calibration code.

13. The method according to claim 11, wherein the first and the second calibration signal are represented by a decreasing voltage ramp and wherein the adjusting of the delay comprises reducing the delay if a value represented by the second calibration code is smaller than a value represented by the first calibration code; and increasing the delay if the value represented by the second calibration code is larger than the value represented by the first calibration code.

14. The method according to claim 11, wherein the first and the second calibration signal represent strictly increasing or strictly decreasing functions of time.

15. The method according to claim 11, wherein the steps of:

generating the calibrated second sub-clock signal;

converting the second calibration signal to the second calibration code;

generating the control signal; and adjusting the delay;

are carried out consecutively for a defined number of times.

16. The method according to claim 11, wherein the steps of:

generating the calibrated second sub-clock signal;

converting the second calibration signal to the second calibration code;

generating the control signal; and adjusting the delay;

are carried out consecutively until the second calibration code and the first calibration code are identical up to a threshold.

17. The method according to claim 11, wherein the first and the second sub-ADC are comprised by a set of at least three sub-ADCs and wherein during the steps of:

providing the second calibration signal;

generating the calibrated second sub-clock signal;

converting the second calibration signal to the second calibration code;

generating the control signal; and adjusting the delay;

the second sub-ADC is operated in a calibration mode of operation, and the remaining of the set of sub-ADCs are operated in a productive mode of operation.

18. The method according to claim 17, wherein the second sub-ADC is operated in the calibration mode for a number of N' clock periods of a reference clock signal and then is operated in the productive mode, wherein N' is equal to a sum of a number N being the total number of sub-ADCs comprised by the set of sub-ADCs and a number R being a positive integer number or zero.

19. The method according to claim 18, wherein the number R is equal to zero and wherein the second sub-ADC is operated in the productive mode for $N*(N-1)$ clock periods of the reference clock signal after being operated in the calibration mode for the number of N' clock periods of the reference clock signal.

20. The method according to claim 18, wherein the number R is a random number within an interval of positive integer numbers or within an interval between zero and a positive integer number.

21. A circuit description representing an interleaved analog to digital converter (ADC), the circuit description stored on a memory device and to be used in an electronic design automation tool, the circuit description comprising:

a first sub-ADC configured to convert a first calibration signal into a first calibration code depending on a first sub-clock signal;

a second sub-ADC comprising a programmable delay element configured to:

generate a calibrated second sub-clock signal by shifting a phase of a second sub-clock signal by a delay depending on a control signal, and convert a second calibration signal into a second calibration code depending on the calibrated second sub-clock signal; and a timing control unit configured to generate the control signal based on a comparison of the second calibration code to the first calibration code, wherein the first and the second calibration signals are time shifted versions of a calibration signal shifted by a first and a second time shift with respect to the calibration signal, respectively; and the first and the second time shift are given by integer multiples of a clock period of a reference clock signal.

22. A circuit description to calibrate an interleaved analog-to-digital converter (ADC), the circuit description stored on a memory device and to be used in an electronic design automation tool, the stored circuit description corresponding to an electronic circuit configured to:

provide a first calibration signal and a first sub-clock signal to a first sub-ADC of the interleaved ADC;

provide a second calibration signal and a second sub-clock signal to a second sub-ADC of the interleaved ADC;

generate a calibrated second sub-clock signal by shifting a phase of the second sub-clock signal by a delay depending on a control signal;

convert the first calibration signal to a first calibration code by means of the first sub-ADC depending on the first sub-clock signal;

convert the second calibration signal to a second calibration code by means of the second sub-ADC depending on the calibrated second sub-clock signal;

generate the control signal based on a comparison of the second calibration code to the first calibration code; and adjust the delay depending on the control signal, wherein the first and the second calibration signal are time shifted versions of a calibration signal shifted by a first and a second time shift with respect to the calibration signal, respectively; and the first and the second time shift are given by integer multiples of a clock period of a reference clock signal.

* * * * *

UNITED STATES PATENT AND TRADEMARK OFFICE
CERTIFICATE OF CORRECTION

| | | |
|---|---|---|
| PATENT NO. | : 9,906,234 B2 | Page 1 of 1 |
| APPLICATION NO. | : 15/319162 | |
| DATED | : February 27, 2018 | |
| INVENTOR(S) | : Pedro Miguel Ferreira de Figueiredo | |

It is certified that error appears in the above-identified patent and that said Letters Patent is hereby corrected as shown below:

In the Claims

Claim 3, Column 15, Line 58, delete "first and the second calibration signal," and insert --first and the second calibration signals--.

Claim 4, Column 16, Line 2, delete "first and the second calibration signal are" and insert --first and the second calibration signals are--.

Claim 4, Column 16, Line 11, delete "code)." and insert --code.--.

Claim 5, Column 16, Line 12, delete "first and the second calibration signal" and insert --first and the second calibration signals--.

Claim 11, Column 17, Line 7, delete "wherein the first and the second calibration signal are" and insert --wherein the first and the second calibration signals are--.

Claim 12, Column 17, Lines 13-14, delete "wherein the first and the second calibration signal are" and insert --wherein the first and the second calibration signals are--.

Claim 14, Column 17, Lines 34-35, delete "the first and the second calibration signal" and insert --the first and the second calibration signals--.

Claim 22, Column 18, Line 64, delete "wherein the first and the second calibration signal are" and insert --wherein the first and the second calibration signals are--.

Signed and Sealed this
Fourth Day of June, 2019

Andrei Iancu
*Director of the United States Patent and Trademark Office*